United States Patent
Kim et al.

(10) Patent No.: US 11,531,427 B2
(45) Date of Patent: Dec. 20, 2022

(54) DISPLAY DEVICE INCLUDING TOUCH SCREEN PANEL

(71) Applicant: SAMSUNG ELECTRONICS CO., LTD., Suwon-si (KR)

(72) Inventors: Jinbong Kim, Yongin-si (KR); Youngtae Son, Suwon-si (KR); Bumsoo Kim, Hwaseong-si (KR); Heejin Lee, Seoul (KR); Wongab Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/550,112

(22) Filed: Dec. 14, 2021

(65) Prior Publication Data

US 2022/0197472 A1   Jun. 23, 2022

(30) Foreign Application Priority Data

Dec. 21, 2020  (KR) .................. 10-2020-0179931
Jun. 8, 2021    (KR) .................. 10-2021-0074302

(51) Int. Cl.
*G06F 3/041*   (2006.01)
*G06F 3/044*   (2006.01)
*G06F 1/16*    (2006.01)

(52) U.S. Cl.
CPC ........ *G06F 3/04182* (2019.05); *G06F 1/1652* (2013.01); *G06F 3/0446* (2019.05); *G06F 3/041662* (2019.05); *G06F 3/0412* (2013.01); *G06F 2203/04102* (2013.01)

(58) Field of Classification Search
CPC ............... G06F 3/0412; G06F 3/04182; G06F 3/041662; G06F 3/0446; G06F 2203/04102; G06F 1/1652
USPC ........................................................ 345/174
See application file for complete search history.

(56) References Cited

U.S. PATENT DOCUMENTS

| | | | |
|---|---|---|---|
| 9,411,462 B2 | 8/2016 | Wright et al. | |
| 9,569,042 B2 | 2/2017 | Han et al. | |
| 9,696,883 B2 | 7/2017 | Oh et al. | |
| 10,249,691 B2 | 4/2019 | Zhai | |
| 10,705,654 B2 | 7/2020 | Kim et al. | |
| 11,079,879 B1 * | 8/2021 | Li | H01L 27/323 |

(Continued)

FOREIGN PATENT DOCUMENTS

KR    2018063175 A  *  6/2018  ....... G02F 1/133345

*Primary Examiner* — Mark Edwards
(74) *Attorney, Agent, or Firm* — Lee IP Law, P.C.

(57) ABSTRACT

A display device, including: a touch screen panel including a touch panel and a display panel stacked under the touch panel; a touch driving circuit; and one or more rollers on which at least a portion of the touch screen panel is rolled. The touch panel may include receiving electrodes extending in a first axis direction and arranged in parallel in a second axis direction perpendicular to the first axis direction and driving electrodes extending in the second axis direction and arranged in parallel in the first axis direction. The display panel may include gate lines and source lines intersecting with the gate lines. The touch driving circuit may be configured to apply driving signals to the driving electrodes. The touch screen panel rolled on the one or more rollers may be unfolded as the one or more rollers slide in the first axis direction.

14 Claims, 11 Drawing Sheets

(56) References Cited

U.S. PATENT DOCUMENTS

| | | | |
|---|---|---|---|
| 2012/0206407 A1* | 8/2012 | Taylor | G06F 3/04184 |
| | | | 345/174 |
| 2013/0141372 A1* | 6/2013 | Kang | G06F 3/0446 |
| | | | 345/173 |
| 2014/0375592 A1* | 12/2014 | Cowd | G06F 3/041662 |
| | | | 345/174 |
| 2015/0248144 A1* | 9/2015 | Hong | G06F 1/3265 |
| | | | 361/679.27 |
| 2015/0331535 A1* | 11/2015 | Li | G06F 3/0446 |
| | | | 348/174 |
| 2016/0363960 A1* | 12/2016 | Park | G06F 1/1656 |
| 2016/0364048 A1 | 12/2016 | Park et al. | |
| 2017/0212636 A1* | 7/2017 | Kim | G09G 3/20 |
| 2018/0004328 A1* | 1/2018 | Gu | G02F 1/13454 |
| 2018/0120977 A1* | 5/2018 | Shim | H01L 29/786 |
| 2019/0114018 A1* | 4/2019 | Maguire | G06F 3/04164 |
| 2019/0261519 A1* | 8/2019 | Park | H05K 5/0017 |
| 2020/0387251 A1* | 12/2020 | Nakanishi | G06F 3/0416 |
| 2021/0034099 A1* | 2/2021 | Liao | G06F 1/163 |

* cited by examiner

DISPLAY DEVICE INCLUDING TOUCH SCREEN PANEL

CROSS-REFERENCE TO RELATED APPLICATIONS

This application is based on and claims priority under 35 U.S.C. § 119 to Korean Patent Application Nos. 10-2020-0179931, filed on Dec. 21, 2020, and 10-2021-0074302, filed on Jun. 8, 2021, in the Korean Intellectual Property Office, the disclosures of which are incorporated by reference herein in their entireties.

BACKGROUND

1. Field

Embodiments relate to a display device, and more particularly, to a display device including a touch screen panel.

2. Description of the Related Art

A display device may include a touch screen panel (TSP), and the TSP may include a display panel for image display and a touch panel for touch sensing.

SUMMARY

Embodiments are directed to a display device, including: a touch screen panel including a touch panel and a display panel stacked under the touch panel; a touch driving circuit; and one or more rollers on which at least a portion of the touch screen panel is rolled. The touch panel may include a plurality of receiving electrodes extending in a first axis direction and arranged in parallel in a second axis direction perpendicular to the first axis direction and a plurality of driving electrodes extending in the second axis direction and arranged in parallel in the first axis direction. The display panel may include a plurality of gate lines and a plurality of source lines intersecting with the plurality of gate lines. The touch driving circuit may be configured to apply a plurality of driving signals to the plurality of driving electrodes. The touch screen panel rolled on the one or more rollers may be unfolded as the one or more rollers slide in the first axis direction.

Embodiments are directed to an operating method of a touch driving circuit for driving a touch panel that includes a plurality of driving electrodes and a plurality of receiving electrodes intersecting with the plurality of driving electrodes, the operating method including: applying a driving signal to the plurality of driving electrodes; receiving a first sensing signal for sensing mutual capacitance formed between sensing nodes where the plurality of driving electrodes intersect with the plurality of receiving electrodes; receiving a second sensing signal for sensing self-capacitance between the plurality of driving electrodes and a ground plane; compensating the first sensing signal based on the second sensing signal; and calculating touch coordinates at which a touch is input on the touch panel.

Embodiments are directed to a display device, including: a touch screen panel including a touch panel and a display panel stacked under the touch panel; and a plurality of rollers on which at least a portion of the touch screen panel is rolled. The touch panel may include a plurality of receiving electrodes extending in a first axis direction and arranged in parallel in a second axis direction perpendicular to the first axis direction, and a plurality of driving electrodes extending in the second axis direction and arranged in parallel in the first axis direction. The display panel may include a plurality of gate lines extending in the first axis direction, and a plurality of source lines extending in the second axis direction. The touch screen panel may be expanded as the plurality of rollers slide in opposite directions in the first axis direction.

BRIEF DESCRIPTION OF THE DRAWINGS

Features will become apparent to those of skill in the art by describing in detail example embodiments with reference to the attached drawings in which.

DETAILED DESCRIPTION

Figure 1:
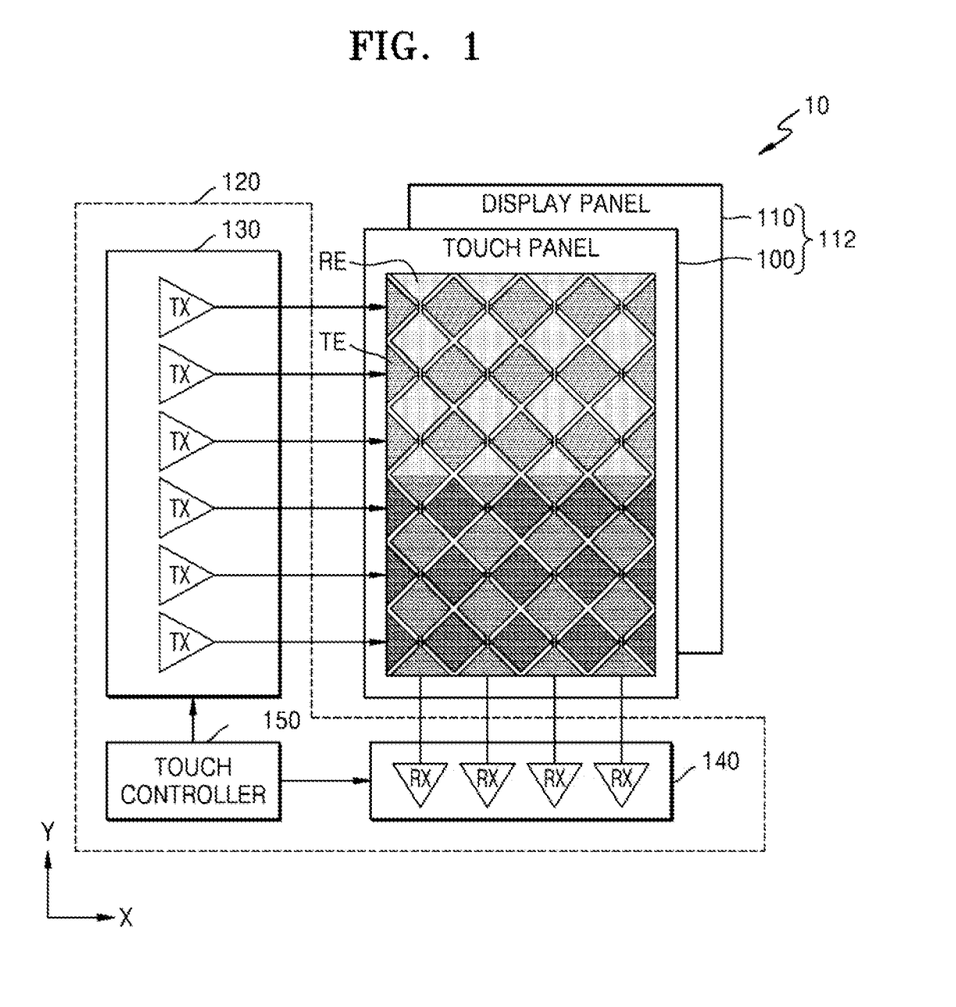
FIG. 1 is a block diagram of a display device according to an example embodiment.

FIG. 1 is a block diagram of a display device 10 according to an example embodiment.

Referring to FIG. 1, the display device 10 may include a touch panel 100, a display panel 110, and a touch driving circuit 120 for driving the touch panel 100. The touch panel 100 may be stacked on the display panel 110 to constitute a touch screen panel 112, or the touch panel 100 may be integrally formed with the display panel 110 to constitute the touch screen panel 112.

The touch screen panel 112 may be formed on a flexible plastic substrate. The shape of the touch screen panel 112 may be flexible or freely changed, and the touch screen panel 112 may be referred to as a flexible panel. For example, the touch screen panel 112 may be changeable in various forms, such as being bendable, foldable, or rollable. The display device 10 may be, e.g., a rollable display device, and a portion of the touch screen panel 112 may be rolled or unfolded. The rollable display device 10 may include a roller (e.g., a roller 200 of FIG. 2) on which at least a portion of the touch screen panel 112 is rolled. As the roller slides in a first axis direction (e.g., a Y-axis direction) or a second axis direction (e.g., an X-axis direction), the touch screen panel 112 may be expanded.

The touch panel 100 may sense a touch (or a touch input) on the touch panel 100, and output sensing signals. In this case, the touch may include not only direct contact of a conductive object (e.g., a user's finger, palm, touch pen, or stylus pen) on the touch panel 100, but also proximity of the conductive object to the touch panel 100.

The touch panel 100 may be stacked on the display panel 110, and may be attached to a front surface (e.g., a surface from which light signals are emitted) of the display panel 110. For example, the touch panel 100 may cover the front surface of the display panel 110.

The touch panel 100 may be implemented as a transparent panel having a touch-sensitive surface. The touch panel 100 may be implemented as a touch sensor array patterned with transparent electrodes. For example, the touch panel 100 may include a transparent electrode having a grid pattern. The touch panel 100 may include a plurality of electrodes (e.g., a plurality of receiving electrodes RE and a plurality of driving electrodes TE) that intersect with each other in a matrix. A plurality of sensing nodes (or touch cells) may be formed at intersections of the plurality of receiving electrodes RE and the plurality of driving electrodes TE.

The plurality of electrodes (e.g., the plurality of receiving electrodes RE and the plurality of driving electrodes TE) may have an arrangement to reduce noise, which noise may vary as the touch screen panel 112 is rolled or unfolded. The display device 10 may include a plurality of driving electrodes TE arranged in parallel in the first axis direction (e.g., the Y-axis direction) to reduce external noise formed in the first axis direction. The display device 10 may include a plurality of receiving electrodes RE arranged in parallel in the second axis direction (e.g., the X-axis direction) to reduce display noise formed in the second axis direction (for example, as discussed below, noise generated while the source voltage is applied, i.e., display noise, may be generated in the second axis direction in which a plurality of source lines SL are arranged).

The touch panel 100 may output sensing signals, according to one of various touch sensing methods, to the touch driving circuit 120. For example, the touch panel 100 may output sensing signals according to a capacitance sensing method through a plurality of electrodes. For example, the touch panel 100 may output a sensing signal representing mutual capacitance formed in a plurality of sensing nodes, and may output a sensing signal representing self-capacitance formed between the plurality of receiving electrodes RE or a plurality of transmitting electrodes (i.e., the plurality of driving electrodes TE) and a ground plane.

The display panel 110 may include a plurality of gate lines, a plurality of source lines, and a plurality of pixels arranged in a matrix at intersections of the plurality of gate lines and the plurality of source lines.

The plurality of pixels may display an image based on image signals received through the plurality of source lines and the plurality of gate lines.

The display device 10 may further include a display driving circuit (not shown) for applying a driving signal to each of the plurality of source lines and the plurality of gate lines.

The display panel 110 may be or include, e.g., a liquid crystal display (LCD), a light-emitting diode (LED) display, an organic LED (OLED) display, an active-matrix OLED (AMOLED) display, an electrochromic display (ECD), a digital mirror display (DMD), an actuated mirror device (AMD), a grating light valve (GLV), a plasma display panel (PDP), an electro luminescent display (ELD), a vacuum fluorescent display (VFD), etc.

Although the touch panel 100 and the display panel 110 are illustrated as separate components in FIG. 1, the electrodes of the touch panel 100 may be implemented as an on-cell type panel in which the electrodes are arranged on the pixels of the display panel 110. For example, the display panel 110 may include a flexible OLED, and the electrodes of the touch panel 100 may be arranged on the pixels of the display panel 110 to provide a flexible structure.

The touch driving circuit 120 may apply a driving signal to the touch panel 100. The touch driving circuit 120 may include a transmitting circuit 130, a receiving circuit 140, and a touch controller 150.

The transmitting circuit 130 may include a plurality of transmitters TX, and each of the plurality of transmitters TX may apply a driving signal to a corresponding driving electrode TE.

The receiving circuit 140 may include a plurality of receivers RX, and each of the plurality of receivers RX may receive a plurality of sensing signals from the plurality of receiving electrodes RE. Each of the plurality of receivers RX may be connected to a corresponding receiving electrode RE to receive a sensing signal, or may be connected to at least two receiving electrodes RE in a time division manner to receive at least two sensing signals.

The touch controller 150 may control operation timings and operation states of the transmitting circuit 130 and the receiving circuit 140. The touch controller 150 may receive sensing signals from the receiving circuit 140 and calculate whether a touch input has occurred and a location (i.e., touch coordinates) where the touch input has occurred, based on the received sensing signals. The touch controller 150 may provide the touch coordinates to a host (not shown).

The touch controller 150 may compensate for noise varying as the touch screen panel 112 is rolled or unfolded. For example, the touch controller 150 may receive a first sensing signal for sensing mutual capacitance between the plurality of driving electrodes TE and the plurality of receiving electrodes RE, may receive a second sensing signal for sensing self-capacitance between the plurality of driving electrodes TE and the ground plane, and may compensate for external noise by summing the first sensing signal with the second sensing signal.

As the touch screen panel 112 is rolled or unfolded, a capacitance value sensed by the touch screen panel 112 without a touch input may vary. For example, when the touch screen panel 112 is rolled by rolling, a main board, a battery, etc., mounted on the display device 10 may come into close contact with each other, and thus, the ambient temperature of the touch screen panel 112 may increase. In this case, a deviation or an error may occur in a value sensed by each of the sensing nodes according to the change in the ambient temperature. To compensate for or address the (e.g., temperature-related) effect on the capacitance value, the touch controller 150 may periodically receive a sensed value from the touch screen panel 112 in a state or an environment where there is no touch input, and may perform ambient compensation for adjusting sensing nodes to a uniform reference value. Thus, the display device 10 may respond to a shape change (e.g., from being rolled up, or by being unrolled) by performing sensing for ambient compensation.

The display device 10 may be mounted on various electronic devices. For example, the display device 10 may be an electronic device such as a smartphone, a tablet personal computer (PC), an e-reader, a personal digital assistant (PDA), a portable multimedia player (PMP), a mobile terminal, a wearable device, an Internet of things (IoT) device, a refrigerator, or a navigation device. In addition, the display device 10 may be mounted on an electronic device provided as a component in a vehicle, furniture, manufacturing equipment, door, various measurement devices, and the like.

Figure 2:
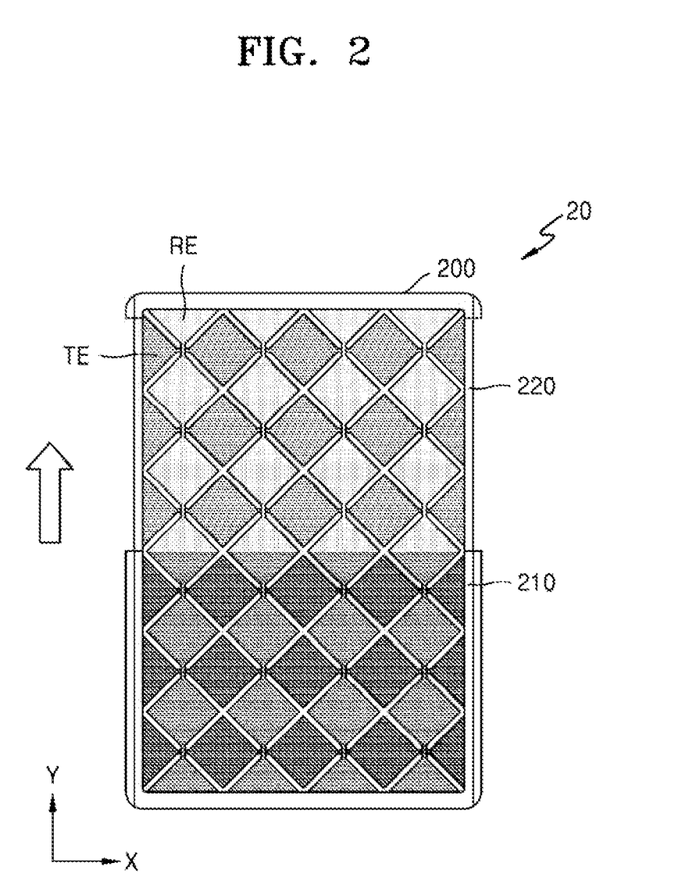
FIG. 2 is a diagram illustrating a display device according to an example embodiment.

FIG. 2 is a diagram illustrating a display device 20 according to an example embodiment.

Referring to FIG. 2, the display device 20 may have a form in which at least a portion of a variable screen panel 220 may be rolled or unfolded.

The display device 20 may include a roller 200, a fixed screen panel 210, and the variable screen panel 220.

A touch screen panel of the display device 20 illustrated in FIG. 2 may include the fixed screen panel 210 and the variable screen panel 220, but the touch screen panel of the display device 20 may include, e.g., only the variable screen panel 220.

The roller 200 may include a rotatable configuration, e.g., may include a bearing. The fixed screen panel 210 may be a panel fixed in the display device 20, and the variable screen panel 220 may be a panel that is rolled or unfolded by rotation of the roller 200. As the roller 200 slides in the first axis direction (e.g., a negative Y-axis direction), at least a portion of the variable screen panel 220 may be rolled on the roller 200. As the roller 200 slides in the first axis direction (e.g., a positive Y-axis direction), at least a portion of the variable screen panel 220 rolled on the roller 200 may be unfolded. Accordingly, the display of the display device 20 may be expanded or reduced.

The fixed screen panel 210 and the variable screen panel 220 may include a plurality of electrodes (e.g., a plurality of receiving electrodes RE and a plurality of driving electrodes TE) that intersect with each other in a matrix.

The plurality of receiving electrodes RE may extend in a sliding direction of the roller 200. For example, the plurality of receiving electrodes RE may extend in the first axis direction (e.g., the Y-axis direction), and may be arranged in parallel in the second axis direction (e.g., the X-axis direction) perpendicular to the first axis direction.

The plurality of driving electrodes TE may intersect with the plurality of receiving electrodes RE, and may extend in a direction perpendicular to the sliding direction of the roller 200. For example, each of the plurality of driving electrodes TE may extend in the second axis direction and may be arranged in parallel in the first axis direction. The plurality of driving electrodes TE may be provided in a number that is determined by as many as may fit in the area or region of the expandable variable screen panel 220.

Using the arrangement of the plurality of electrodes, the display device 20 may operate to reduce noise that varies as the variable screen panel 220 is rolled or unfolded. For example, display noise may be formed in the second axis direction in the display device 10. The display noise may be filtered by a filter circuit connected to each of the plurality of receivers RX arranged in parallel in the second axis direction. In addition, external noise may be formed in the first axis direction in the display device 10. The external noise may be compensated for by sensing self-capacitance in the plurality of driving electrodes TE arranged in the first axis direction.

The transmitter TX of FIG. 1 (which is connected to each of the plurality of driving electrodes TE) may be turned on or off according to the expansion or contraction (e.g., rolling and unrolling) of the fixed screen panel 210 and the variable screen panel 220. For example, when the variable screen panel 220 is rolled as the roller 200 slides in the first axis direction (e.g., the negative Y-axis direction), at least one transmitter TX connected to a rolled region of the variable screen panel 220 may be turned off.

Figure 3:
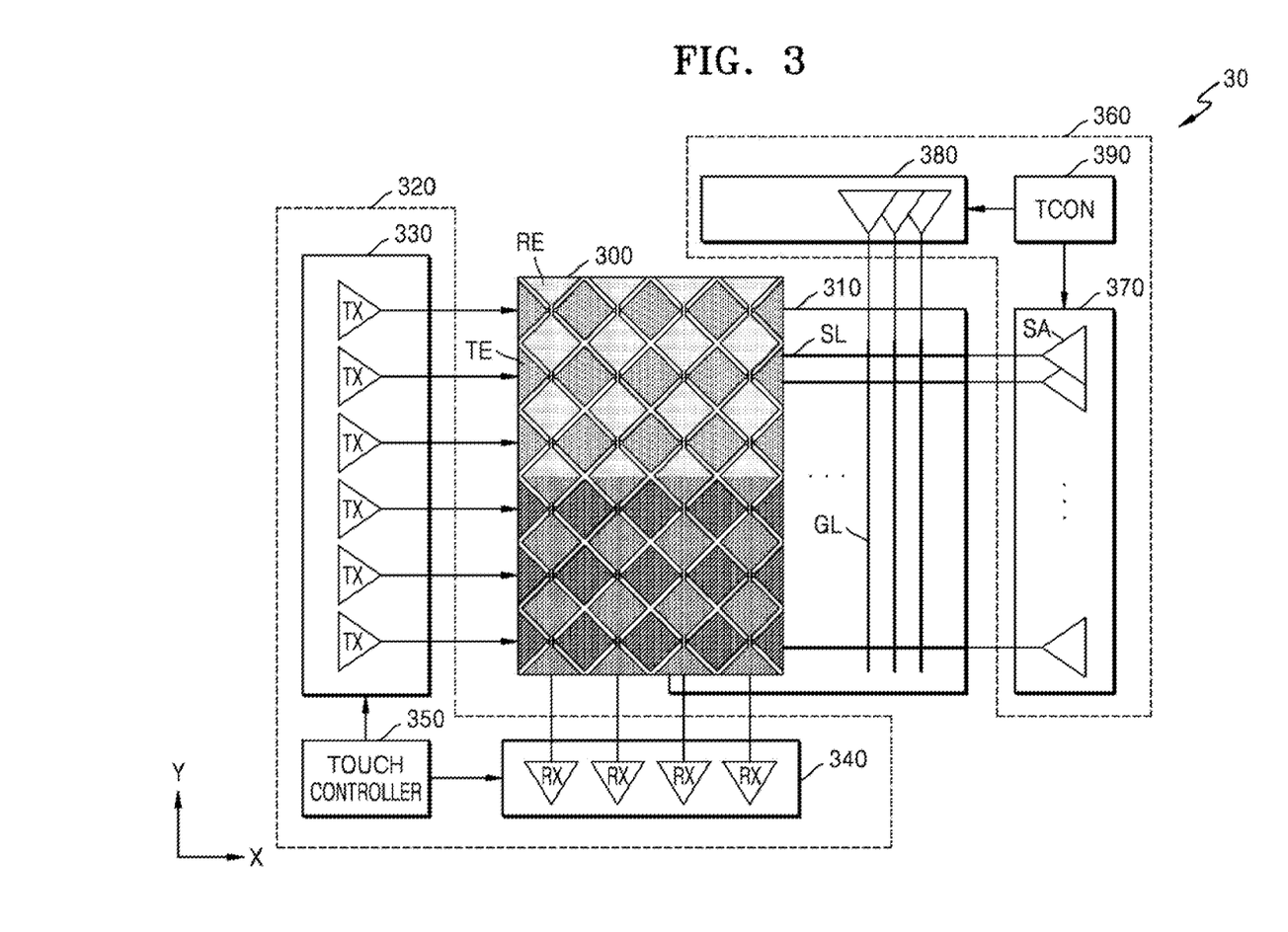
FIG. 3 is a block diagram of a display device according to an example embodiment.

FIG. 3 is a block diagram of a display device 30 according to an example embodiment.

Referring to FIG. 3, the display device 30 may include a touch panel 300, a display panel 310, a touch driving circuit 320, and a display driving circuit 360.

The display panel 310 may include a plurality of source lines SL and a plurality of gate lines GL intersecting with the plurality of source lines SL. For example, the plurality of gate lines GL may extend in a first axis direction (e.g., a Y-axis direction), and the plurality of source lines SL may extend in a second axis direction (e.g., an X-axis direction).

The display driving circuit 360 may include a source driver 370, a gate driver 380, and a timing controller (TCON) 390. The timing controller 390 may convert a data signal input from a host (not shown) and provide the converted data signal to the source driver 370 and the gate driver 380. The timing controller 390 may provide a timing signal indicating an operation timing or a control signal to the source driver 370 and the gate driver 380.

The touch panel 300 may be stacked on the display panel 310, in which case display noise may be introduced into a sensing signal output from the touch panel 300. For example, a plurality of source amplifiers SA may apply a source voltage to the plurality of source lines SL in response to a horizontal synchronization signal received from the timing controller 390. Noise generated while the source voltage is applied, i.e., display noise, may be generated in the second axis direction in which the plurality of source lines SL are arranged.

The touch panel 300 may include a plurality of receiving electrodes RE arranged in parallel in the second axis direction.

A receiving circuit 340, e.g., in the touch driving circuit 320, may include a plurality of receivers RX, and each of the plurality of receivers RX may receive a sensing signal from a corresponding receiving electrode among the plurality of receiving electrodes RE. Each of the plurality of receivers RX may include a filter circuit that removes display noise from the sensing signal. For example, the filter circuit may filter a certain level of display noise from a sensing signal received from a corresponding receiving electrode, and may convert a filtered signal into an analog signal.

A transmitting circuit 330, e.g., in the touch driving circuit 320, may include a plurality of transmitters TX, and each of the plurality of transmitters TX may be connected to each of the plurality of driving electrodes TE. In some embodiments, only a portion of the plurality of driving electrodes TE may be driven by a portion of the plurality of transmitters TX. Thus, at least one driving electrode may not be driven and may be used to sense noise. The at least one driving electrode may be referred to as an antenna. Display noise included in signals received through the plurality of receiving electrodes RE may be removed based on the nose sensed by the antenna. Thus, a signal-to-noise ratio may be improved.

Figure 4:
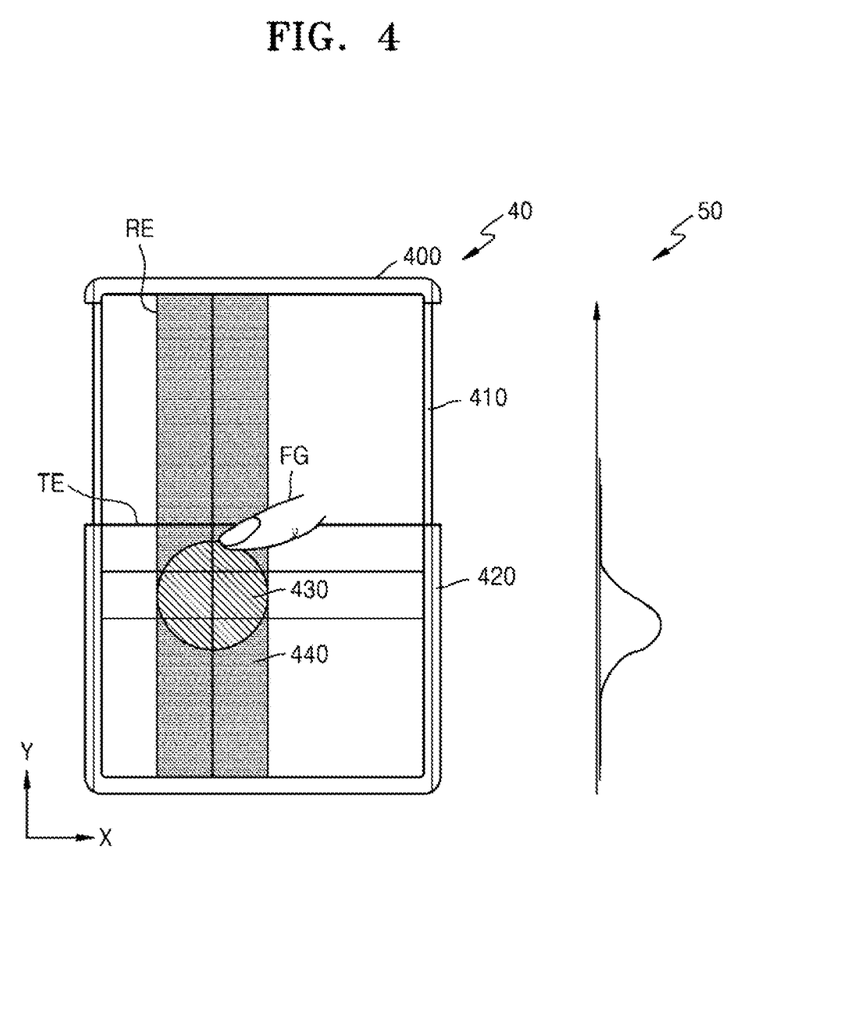
FIG. 4 is a diagram illustrating a display device according to an example embodiment

FIG. 4 is a diagram illustrating a display device 40 according to an example embodiment. In FIG. 4, a graph 50 represents self-capacitance sensed through a plurality of driving electrodes TE.

Referring to FIG. 4, the display device 40 may include a touch screen panel, a fixed screen panel 410, a variable screen panel 420, and a roller 400.

A touch screen panel of the display device 40 illustrated in FIG. 4 may include the fixed screen panel 410 and the variable screen panel 420, or the touch screen panel of the display device 40 may include, e.g., only the variable screen panel 420.

The fixed screen panel 410 and the variable screen panel 420 may include a plurality of electrodes (e.g., a plurality of receiving electrodes RE and a plurality of driving electrodes TE) that intersect with each other in a matrix.

The plurality of receiving electrodes RE may extend in a sliding direction of the roller 400. For example, the plurality of receiving electrodes RE may extend in the first axis direction (e.g., the Y-axis direction), and may be arranged in parallel in the second axis direction (e.g., the X-axis direction) perpendicular to the first axis direction.

The plurality of driving electrodes TE may intersect with the plurality of receiving electrodes RE, and may extend in a direction perpendicular to the sliding direction of the roller 400. For example, each of the plurality of driving electrodes TE may extend in the second axis direction and may be arranged in parallel in the first axis direction. The plurality of driving electrodes TE may be provided by as many as may fit in the region of the expandable variable screen panel 420.

When a conductive object FG (e.g., a human finger) touches the touch screen panel of the fixed screen panel 410 and the variable screen panel 420, a touch region 430 may be generated. Also, external noise may be applied to a wider range than the touch region 430 through the conductive object FG. For example, the external noise may be formed in a rectangular region 440 in the first axis direction (e.g., the Y-axis direction), in which the plurality of receiving electrodes RE extend. A sensing signal output from a touch screen panel of the fixed screen panel 410 and the variable screen panel 420 may be distorted by the external noise.

The display device 40 may sense self-capacitance formed in the first axis direction in which the plurality of driving electrodes TE are arranged side by side.

In FIG. 4, the graph 50 represents self-capacitance sensed through the plurality of driving electrodes TE. A self-capacitance value may be sensitively sensed at a region where the plurality of driving electrodes TE overlap the touch region 430. The display device 40 may correct external noise formed in the rectangular region 440, based on the sensing of the self-capacitance formed in the first axis direction.

Figure 5:
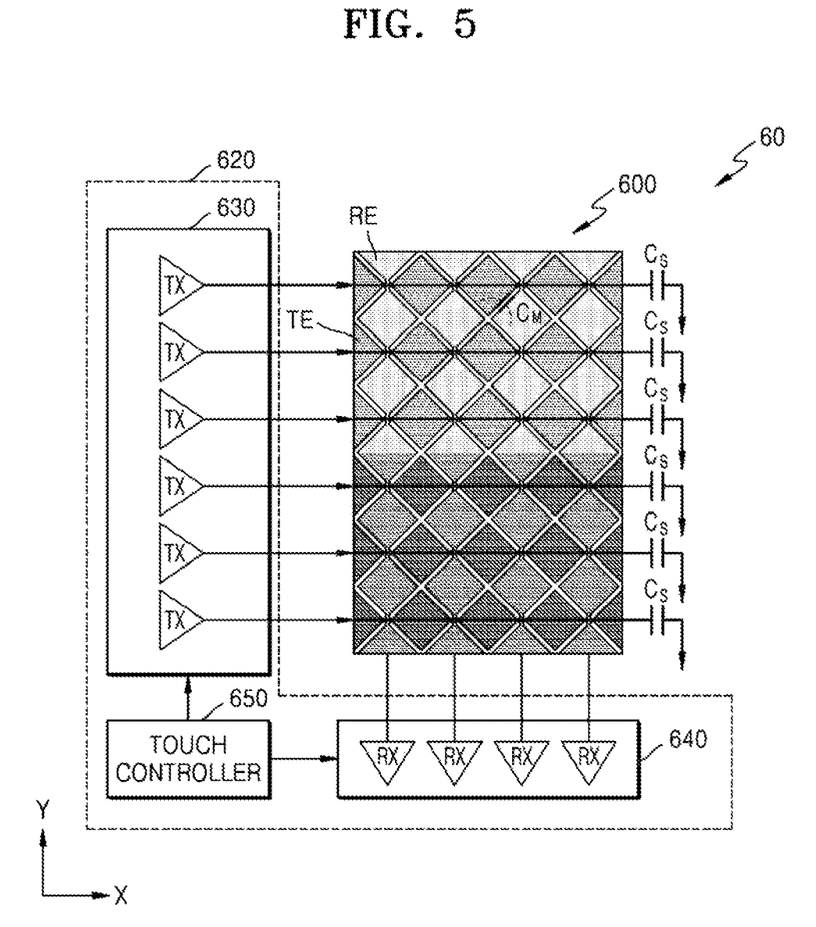
FIG. 5 is a block diagram of a display device according to an example embodiment.

FIG. 5 is a block diagram of a display device 60 according to an example embodiment.

Referring to FIG. 5, the display device 60 may include a touch panel 600 and a touch driving circuit 620.

The touch panel 600 may output sensing signals according to a capacitive sensing method. The touch panel 600 may include a plurality of driving electrodes TE, to which a driving signal is applied, and a plurality of receiving electrodes RE, from which a sensing signal is output.

The plurality of receiving electrodes RE may extend in a first axis direction (e.g., a Y-axis direction), and may be arranged in parallel in a second axis direction (e.g., an X-axis direction) perpendicular to the first axis direction.

The plurality of driving electrodes TE may extend in the second axis direction, and may be arranged in parallel in the first axis direction.

The plurality of driving electrodes TE may intersect with the plurality of receiving electrodes RE to form sensing nodes. When a driving signal is applied to the plurality of driving electrodes TE, charge coupling with the plurality of receiving electrodes RE may occur to form a mutual capacitance $C_M$. When a conductive object, such as a human finger or a stylus, touches or is adjacent to a sensing node, charge sharing may occur between the sensing node and the conductive object, thereby changing the mutual capacitance $C_M$. The intensity of a sensing signal output to a receiving circuit 640 through the plurality of receiving electrodes RE may be changed according to the changed mutual capacitance $C_M$. For example, the level of the sensing signal may decrease compared to a state before a touch occurs.

A self-capacitance $C_S$ may be formed between each of the plurality of driving electrodes TE to which a driving signal is applied and a ground plane. When a conductive object touches a driving electrode TE or is adjacent to the driving electrode TE, the self-capacitance $C_S$ may change with respect to the ground plane. The intensity of a sensing signal output to the driving circuit 630 through the plurality of driving electrodes TE may change according to the changed self-capacitance $C_S$. For example, the level of the sensing signal may increase compared to a state before a touch occurs.

The touch panel 600 may sense mutual capacitances $C_M$ formed in a plurality of sensing nodes, and may output a first sensing signal. As described above with reference to FIG. 4, external noise formed in a direction (e.g., the Y-axis direction) in which the plurality of receiving electrodes RE extend may be added to the first sensing signal. The touch panel 600 may output a second sensing signal by sensing the self-capacitance $C_S$ connected between each of the plurality of driving electrodes TE and the ground plane. The second sensing signal may represent a capacitance that changes in the direction (e.g., the Y-axis direction) in which the plurality of receiving electrodes RE extend. The touch driving circuit 620 may compensate for external noise based on a signal obtained by adding the first sensing signal to the second sensing signal, and may calculate touch coordinates at which an input to the touch panel 600 is generated.

Figure 6:
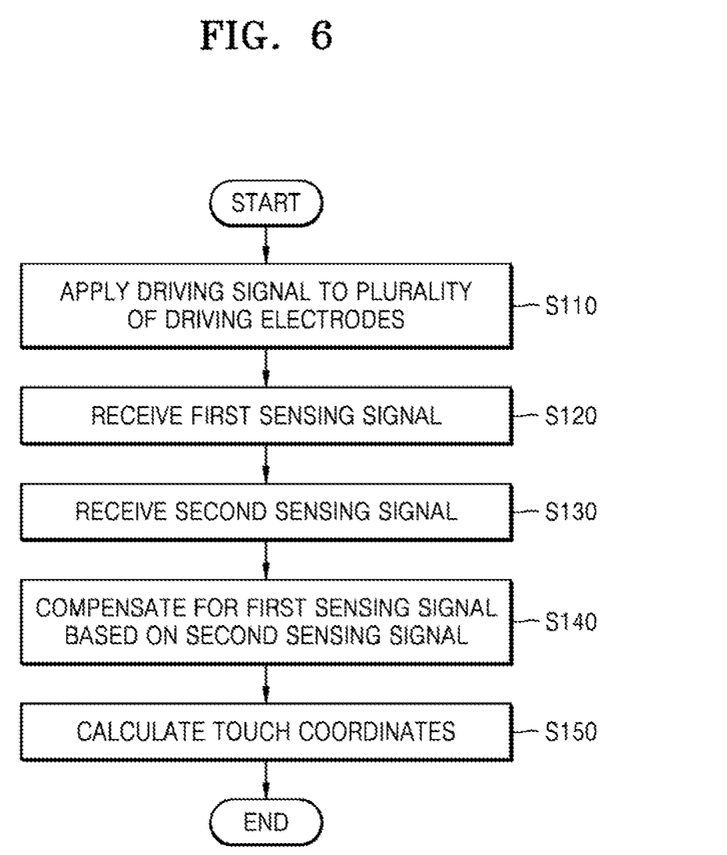
FIG. 6 is a flowchart illustrating an operating method of a touch controller according to an example embodiment.

FIG. 6 is a flowchart illustrating an operating method of a touch controller according to an example embodiment. FIG. 6 will be described with reference to FIG. 5.

Referring to FIG. 6, in operation S110, the touch controller 650 may apply a driving signal to the plurality of driving electrodes TE of the touch panel 600.

In operation S120, the touch controller 650 may receive a first sensing signal through the plurality of receiving electrodes RE. The first sensing signal may be a signal representing a mutual capacitance $C_M$ formed at sensing nodes where the plurality of driving electrodes TE intersect with the plurality of receiving electrodes RE. The first sensing signal may be distorted by external noise generated in a direction (e.g., the Y-axis direction) in which the plurality of receiving electrodes RE are arranged.

In operation S130, the touch controller 650 may receive a second sensing signal through the plurality of driving electrodes TE. The second sensing signal may be a signal representing a self-capacitance $C_S$ formed between the plurality of driving electrodes TE and a ground plane. The second sensing signal may be a signal for detecting a change in the self-capacitance $C_S$ in the direction in which the plurality of receiving electrodes RE are arranged.

In operation S140, the touch controller 650 may compensate the first sensing signal based on the second sensing signal. For example, the touch controller 650 may sum the first sensing signal with the second sensing signal. A signal obtained by the summing may be a signal in which external noise is compensated for in the first sensing signal.

In operation S150, the touch controller 650 may calculate touch coordinates based on a compensated signal. For example, the touch controller 650 may calculate touch coordinates with high accuracy from a signal obtained by summing the first sensing signal with the second sensing signal.

Figure 7:
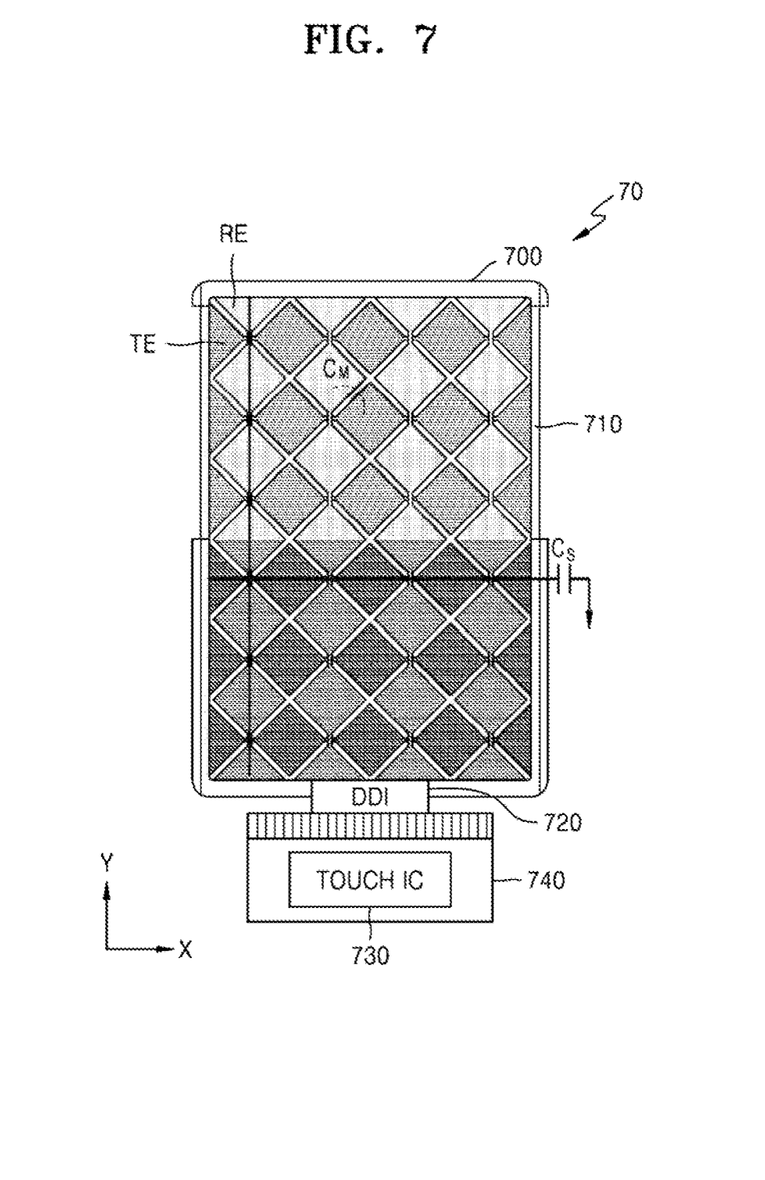
FIG. 7 is a diagram illustrating a display device according to an example embodiment.

FIG. 7 is a diagram illustrating a display device 70 according to an example embodiment.

Referring to FIG. 7, the display device 70 may be expanded or contracted as a roller 700 slides in a first axis direction (e.g., a Y-axis direction).

The roller 700 may be on one side of the display device 70, and a display driving circuit (DDI) 720 and a touch driving circuit (touch IC) 730 may be in a region opposite to the roller 700. The region opposite to the roller 700 is a non-sliding region, and may prevent the display driving circuit 720 and the touch driving circuit 730 from being damaged by sliding.

The display driving circuit 720 may be mounted on an extended portion of the touch screen panel 710, e.g., in a chip on film method.

The touch driving circuit 730 may be mounted on a flexible printed circuit board (PCB) 740. Although not shown in FIG. 7, a memory may also be mounted on the flexible PCB 740 to store commands transmitted from a host to the touch driving circuit 730.

The flexible PCB 740 may be on the front or rear side of the display device 70.

Figure 8:
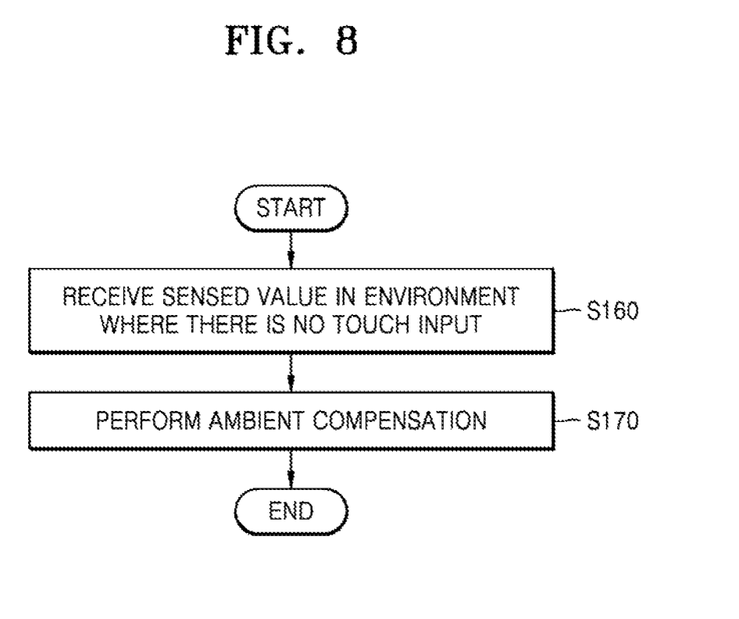
FIG. 8 is a flowchart illustrating an operating method of a touch controller according to an example embodiment.

FIG. 8 is a flowchart illustrating an operating method of a touch controller according to an example embodiment. FIG. 8 will be described with reference to FIG. 7.

Referring to FIG. 8, in operation S160, the touch controller in the touch driving circuit 730 may periodically receive a sensed value from the touch screen panel 710 in an environment where there is no touch input. As the touch screen panel 710 is rolled or unfolded, a capacitance value sensed by the touch screen panel 710 without a touch input may vary. For example, when the touch screen panel 710 is rolled by rolling, a memory, a main board, a battery, etc., mounted on the display device 70 may come into close contact with each other, and thus, the ambient temperature of the touch screen panel 710 may increase. On the other hand, when the touch screen panel 710 is unfolded by rolling, the ambient temperature may change due to residual heat in the touch screen panel 710 or the ambient temperature may decrease due to rapid cooling. A deviation or an error may occur in a value sensed by each of the sensing nodes, according to a change in the ambient temperature.

In operation S170, the touch controller in the touch driving circuit 730 may perform ambient compensation based on the sensed value received in operation S160. The touch controller may compensate for noise from the sensed value, and adjust the sensed value to a uniform reference value. When a touch is input to the touch screen panel 710, the touch screen panel 710 may output a sensed value changed from a reference value, and thus, a decrease in touch sensing sensitivity due to a change in the shape of the display device 70 may be prevented.

Figure 9:
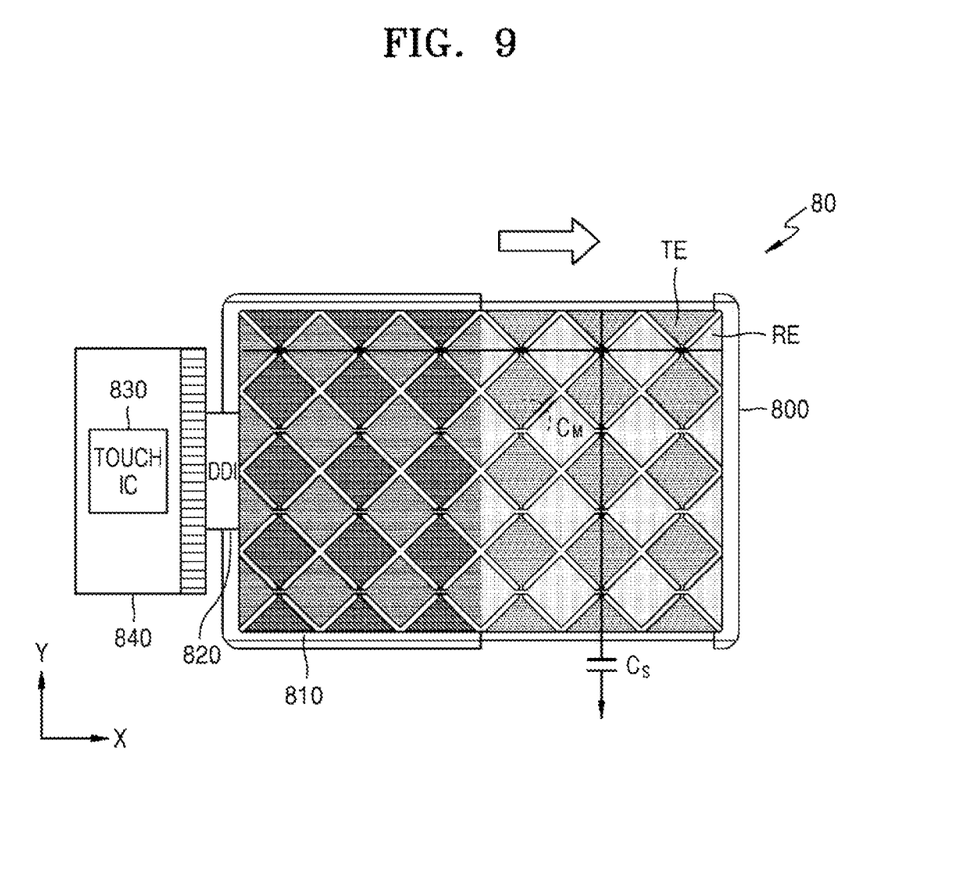
FIG. 9 is a diagram illustrating a display device according to an example embodiment.

FIG. 9 is a diagram illustrating a display device 80 according to an example embodiment.

Referring to FIG. 9, the display device 80 may be expanded or contracted as a roller 800 slides in a second axis direction (e.g., an X-axis direction). The display device 80 may include a plurality of driving electrodes TE each extending in a first axis direction (e.g., a Y-axis direction) and arranged in parallel in the second axis direction (e.g., the X-axis direction) perpendicular to the first axis direction (e.g., in the Y-axis direction). The display device 80 may include a plurality of receiving electrodes RE extending in the second axis direction and arranged in parallel in the first axis direction. A mutual capacitance $C_M$ may be formed in a plurality of sensing nodes where the plurality of driving electrodes TE intersect with the plurality of receiving electrodes RE, and a self-capacitance $C_S$ may be formed between each of the plurality of driving electrodes TE and a ground plane.

The roller 800 may be on one side of the display device 80, and a display driving circuit 820 and a touch driving circuit 830 may be in a region opposite to the roller 800. The region opposite to the roller 800 is a non-sliding region, and may prevent the display driving circuit 820 and the touch driving circuit 830 from being damaged by sliding.

The display driving circuit 820 may be mounted on an extended portion of the touch screen panel 810 in a chip on film method.

The touch driving circuit 830 may be mounted on a flexible PCB 840. Although not shown in FIG. 9, a memory may also be mounted on the flexible PCB 840 to store commands transmitted from a host to the touch driving circuit 830.

The flexible PCB 840 may be, e.g., on the front or rear side of the display device 80.

Figure 10:
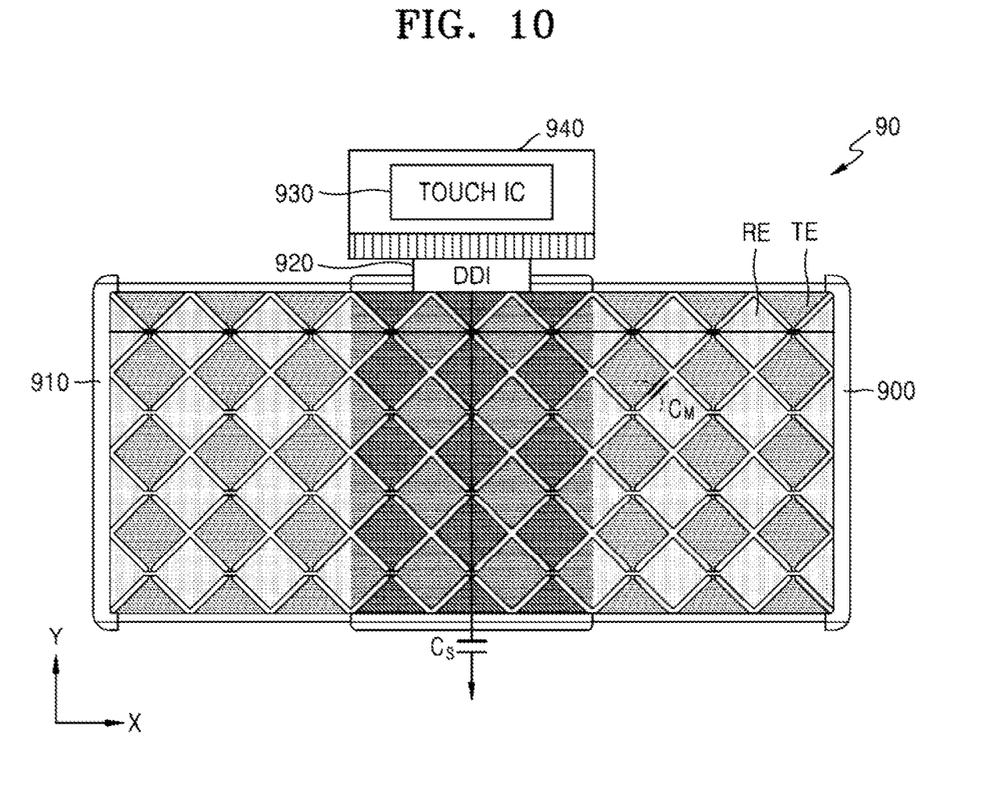
FIG. 10 is a diagram illustrating a display device according to an example embodiment.

FIG. 10 is a diagram illustrating a display device 90 according to an example embodiment.

Referring to FIG. 10, the display device 90 may be expanded or reduced as a roller 900 slides in a second axis direction (e.g., an X-axis direction). The display device 90 may include a plurality of rollers, e.g., first and second rollers 900 and 910. The first and second rollers 900 and 910 may be arranged parallel to a first axis direction (e.g., a Y-axis direction). As the first and second rollers 900 and 910 slide away from each other, the display device 90 may be expanded. For example, the first roller 900 may slide in a positive direction of the second axis (e.g., a positive X-axis direction), and the second roller 910 may slide in a negative direction of the second axis (e.g., a negative X-axis direction).

A mutual capacitance $C_M$ may be formed in a plurality of sensing nodes where a plurality of driving electrodes TE intersect with a plurality of receiving electrodes RE, and a self-capacitance $C_S$ may be formed between each of the plurality of driving electrodes TE and a ground plane.

A display driving circuit 920 and a touch controller 930 may be mounted on a flexible PCB 940 and on the front or rear side of the display device 90. The display driving circuit 920 and the touch controller 930 may be arranged parallel to the second axis direction (e.g., the X-axis direction) perpendicular to the first axis direction (e.g., the Y-axis direction).

Figure 11:
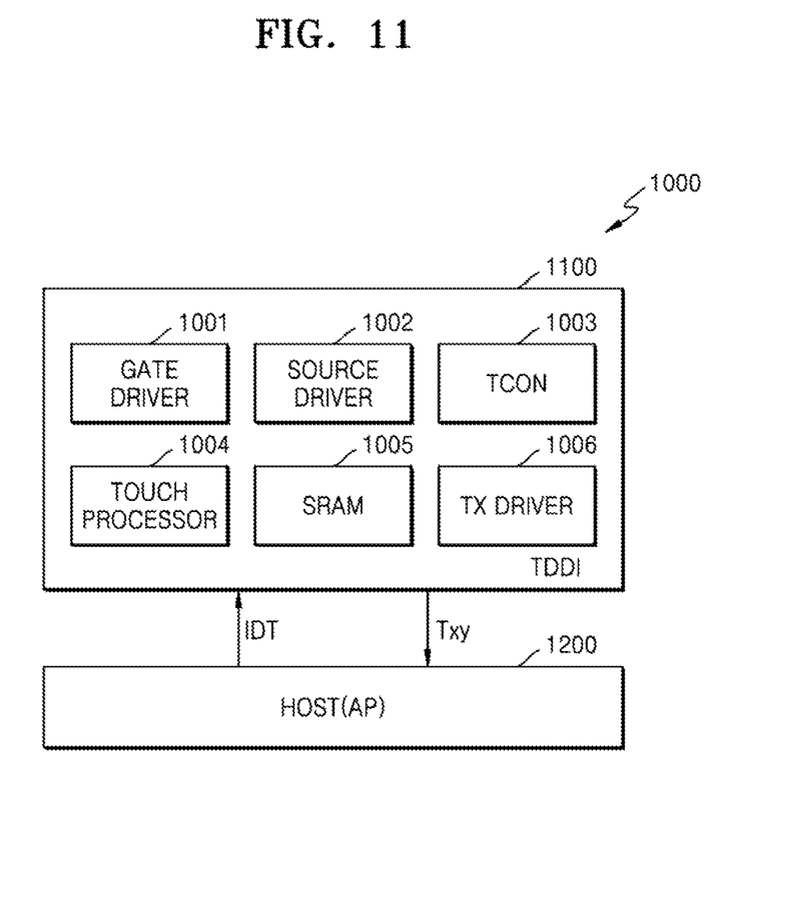
FIG. 11 is a block diagram of a touch screen system according to an example embodiment.

FIG. 11 is a block diagram of a touch screen system 1000 according to an example embodiment.

Referring to FIG. 11, the touch screen system 1000 may include a touch screen driving circuit 1100 and a host (AP) 1200.

The touch screen driving circuit 1100 may be integrated in one semiconductor chip, and may be referred to as a touch display driving circuit TDDI. The touch screen driving circuit 1100 may include a gate driver 1001, a source driver 1002, a timing controller (TCON) 1003, a touch processor 1004, static random access memory (SRAM) 1005, and a TX driver 1006, which may be integrated in one or more separate semiconductor chips.

The host 1200 may perform overall control operations for the touch screen system 1000. As an example, the host 1200 may generate data IDT related to a display operation and provide the data IDT to the touch screen driving circuit 1100, or may receive a touch recognition result, e.g., whether a touch has occurred, and touch coordinates Txy, and perform various control operations using the received touch recognition result.

As an implementation example, the host 1200 may include an application processor, and the application processor may be implemented as a system on chip (SoC). The SoC may include a system bus (not shown) to which a protocol having a certain standard bus specification is applied, and may include various intellectual properties (IPs) connected to the system bus.

By way of summation and review, a display device may be formed on a flexible plastic substrate, and thus, the shape of the touch screen panel may be freely changed, such as by being folded or rolled. However, noise may be introduced into a touch sensing signal and may vary according to a changed shape of the touch screen panel, such that a touch sensing sensitivity may be lowered.

As described above, embodiments may provide a structure of a touch screen panel for reducing noise, which noise may vary as the touch screen panel is rolled or unfolded, and a display device including the structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a touch screen panel including a fixed screen panel portion and a variable screen panel portion, the touch screen panel including a touch panel and a display panel stacked under the touch panel;
   a touch driving circuit; and
   one or more rollers on which the variable screen panel portion is rolled, such that the variable screen panel portion can expand and reduce in size while the fixed screen panel portion maintains a fixed size, wherein:
   the touch panel includes a plurality of receiving electrodes extending in a first axis direction and arranged in parallel in a second axis direction perpendicular to the first axis direction and a plurality of driving electrodes extending in the second axis direction and arranged in parallel in the first axis direction,
   the display panel includes a plurality of gate lines and a plurality of source lines intersecting with the plurality of gate lines,
   the touch driving circuit is configured to apply a plurality of driving signals to the plurality of driving electrodes, and
   the variable screen panel portion rolled on the one or more rollers is unfolded as the one or more rollers slide in the first axis direction.

2. The display device as claimed in claim 1, wherein the plurality of source lines extend in the second axis direction on the display panel and are arranged in parallel in the first axis direction.

3. The display device as claimed in claim 1, wherein:
   the touch panel is configured to output a first sensing signal for sensing mutual capacitance formed at sensing nodes where the plurality of receiving electrodes intersect with the plurality of driving electrodes, and
   the touch panel is configured to output a second sensing signal for sensing self-capacitance formed between the plurality of driving electrodes and a ground plane.

4. The display device as claimed in claim 3, wherein the touch driving circuit includes a touch controller configured to calculate touch coordinates, at which an input to the touch panel is generated, based on a signal obtained by adding the first sensing signal to the second sensing signal.

5. The display device as claimed in claim 3, wherein the touch driving circuit includes a touch controller configured to compensate for external noise generated in the first axis direction in the first sensing signal, based on the second sensing signal.

6. The display device as claimed in claim 1, wherein:
   the touch driving circuit includes a transmitting circuit connected to the plurality of driving electrodes, and
   the plurality of driving electrodes include at least one driving electrode for sensing noise caused by driving of the display panel when the at least one driving electrode is not driven by the transmitting circuit.

7. The display device as claimed in claim 6, wherein the touch driving circuit is further configured to deactivate at least one transmitter, connected to a rolled touch panel region, when the variable screen panel portion is rolled as the one or more rollers slide in the first axis direction.

8. The display device as claimed in claim 1, wherein the touch driving circuit includes a receiving circuit connected to the plurality of receiving electrodes, the receiving circuit including a plurality of receivers, each of which is configured to receive a sensing signal from a corresponding one of the plurality of receiving electrodes and includes a filter circuit for removing display noise in the sensing signal.

9. The display device as claimed in claim 1, wherein a total number of the plurality of driving electrodes is determined based on an area of the variable screen panel portion that extends in the first axis direction.

10. The display device as claimed in claim 1, wherein the touch driving circuit is opposite the one or more rollers.

11. A display device, comprising:
    a touch screen panel including a fixed screen panel portion and a variable screen panel portion, the touch screen panel including a touch panel and a display panel stacked under the touch panel; and
    a plurality of rollers on which the variable screen panel portion is rolled, such that the variable screen panel portion can expand and reduce in size while the fixed screen panel portion maintains a fixed size, wherein:
    the touch panel includes a plurality of receiving electrodes extending in a first axis direction and arranged in parallel in a second axis direction perpendicular to the first axis direction, and a plurality of driving electrodes extending in the second axis direction and arranged in parallel in the first axis direction,
    the display panel includes a plurality of gate lines extending in the first axis direction, and a plurality of source lines extending in the second axis direction, and
    the variable screen panel portion is expanded as the plurality of rollers slide in opposite directions in the first axis direction.

12. The display device as claimed in claim 11, further comprising:
    a display driving circuit configured to apply driving signals to the plurality of gate lines and the plurality of source lines, respectively; and
    a touch driving circuit configured to apply a driving voltage to the plurality of driving electrodes.

13. The display device as claimed in claim 12, wherein:
    the plurality of rollers are arranged in parallel in the first axis direction, and the display driving circuit and the touch driving circuit are arranged in parallel in the second axis direction.

14. The display device as claimed in claim 12, wherein the display driving circuit and the touch driving circuit are mounted in a single semiconductor chip.

* * * * *